United States Patent [19]

Rossnick

[11] Patent Number: 5,191,302

[45] Date of Patent: Mar. 2, 1993

[54] MOSFET OSCILLATOR FOR SUPPLYING A HIGH-POWER RF INDUCTIVE LOAD

[75] Inventor: Melvin Rossnick, Riverdale, N.Y.

[73] Assignee: Lepel Corporation, Edgewood, N.Y.

[21] Appl. No.: 797,524

[22] Filed: Nov. 25, 1991

[51] Int. Cl.⁵ .......................... H03B 1/02; H03B 5/12
[52] U.S. Cl. .................................. 331/109; 219/10.77; 331/117 FE; 331/167; 331/182
[58] Field of Search ................. 331/109, 112, 117 FE, 331/167, 182, 183; 219/10.75, 10.77

[56] References Cited

U.S. PATENT DOCUMENTS

| | | | |
|---|---|---|---|
| 3,448,407 | 6/1969 | Lankreijer | 331/167 |
| 4,001,725 | 1/1977 | Rossnick | 331/117 R |
| 4,321,563 | 3/1982 | Lesartre | 331/117 FE |
| 4,471,196 | 9/1984 | Frank et al. | 219/10.77 |

Primary Examiner—Siegfried H. Grimm
Attorney, Agent, or Firm—Seidel, Gonda, Lavorgna & Monaco

[57] ABSTRACT

A self-excited solid-state oscillator for supplying a high-power RF inductive load. The oscillator includes at least one MOSFET transistor connected in a self-excited oscillator configuration, an output tuned circuit including an inductive load and a tank circuit connected to the load, the tank circuit having a resonant frequency determined at least in part by the inductance of the load, an RF feedback transformer coupling the tank circuit to the gate of the MOSFET for providing a switching signal to the MOSFET for causing the MOSFET to alternate between the on state and the off state at a frequency equal to the resonant frequency of the tank circuit, and a bias circuit for superimposing a forward bias voltage on the switching signal.

4 Claims, 2 Drawing Sheets

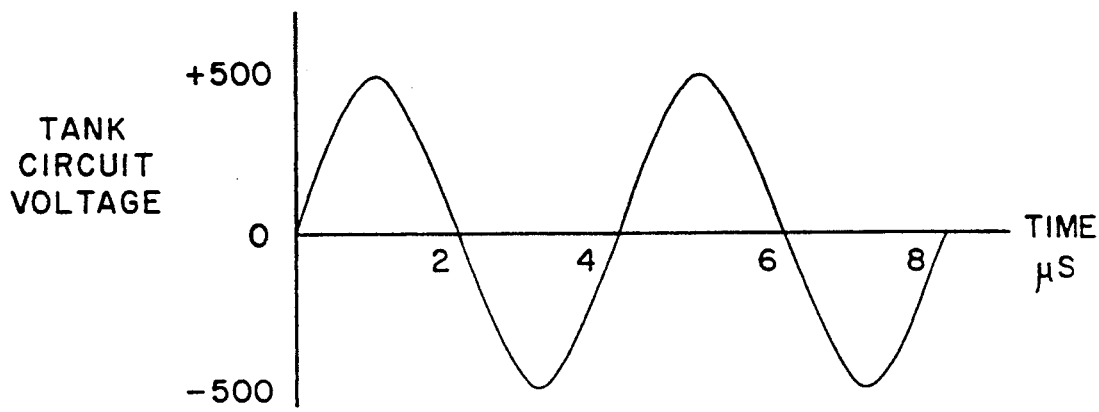
FIG.2A
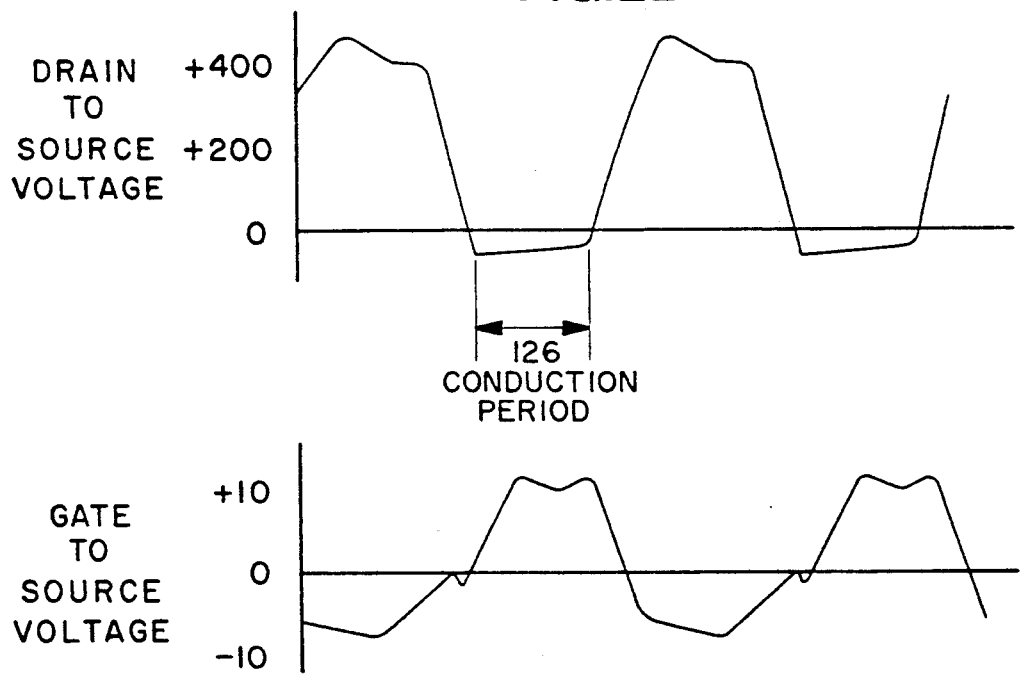
FIG.2B
FIG.2C

MOSFET OSCILLATOR FOR SUPPLYING A HIGH-POWER RF INDUCTIVE LOAD

FIELD OF THE INVENTION

The present invention relates to power supplies for generating a high-frequency, high-power output to a load with the flexibility to match a wide range of load impedances. The present invention is particularly useful in connection with, but by no means limited to, induction heating applications. Although the invention is not limited to induction heating, for ease of understanding the invention it will be described in that context.

BACKGROUND OF THE INVENTION

As those skilled in the art will understand, induction heating is the heating of a nominally electrically conducting material by eddy currents induced by a time-varying magnetic field generated by an induction coil. The principle of induction heating is similar to that of a transformer. The induction coil can be considered the primary winding of a transformer, with the workpiece to be heated as a single-turn secondary. When an alternating current flows in the induction coil, secondary currents will be induced in the workpiece. These induced currents are called eddy currents, and the power dissipated by the eddy currents as they flow in the workpiece heats the workpiece.

Induction heating is widely employed in industry for a variety of industrial processes. While carbon steel is the most common material heated, induction heating is also used with many other conducting materials such as stainless steel, aluminum, brass, copper, nickel, and titanium products. Induction heating is widely employed in the melting, holding and superheating of ferrous and nonferrous metals in coreless and channel furnaces; in the forging, forming, and rolling of slabs, billets and bars; in heat treatment, such as hardening, annealing, and tempering applications; surface conditioning, such as curing of coatings, sintering, and semiconductor processing; and metal joining, such as welding, brazing, and soldering.

Induction heating offers several advantages over conventional (i.e., fossil fuel) heating processes. Heating is induced directly into the material. It is therefore an extremely rapid method of heating. It is not limited by the relatively slow rate of heat diffusion in conventional processes using surface-contact or radiant heating methods. Because of skin effect, the heating is localized and the heated area is easily controlled by the shape and size of the induction coil. Induction heating is easily controllable, resulting in uniform high quality of the product. Induction heating lends itself to automation, in-line processing, and automatic-process cycle control. Startup time is short, and standby losses are low or nonexistent. Working conditions are better because of the absence of noise, fumes, and radiated heat.

For efficient heating, the frequency of the alternating current in the induction coil, and thus the frequency of the magnetic field, must be high enough so that the depth of current penetration is less than one-third the diameter or cross-section of the material being heated. When the workpieces are small, it is necessary to use higher frequencies to efficiently heat the workpiece. Likewise, higher frequencies must be used when it is necessary to concentrate the heat near the surface, as in surface hardening operations. Solid-state power supplies are most often used to generate the high frequency power needed to excite the induction coil.

Various forms of solid-state power supplies exist for supplying power to induction coils for induction heating. One example is a self-excited class C oscillator using a single bipolar transistor, which generates power outputs of approximately 100 W into the megahertz frequency range. However, even small induction heating devices require power levels of 200 W to 1000 W of output.

U.S. Pat. No. 4,001,725, by the same inventor as the present invention, discloses a solid-state self-excited oscillator employing several series-connected bipolar transistors to provide a high power output. The circuit disclosed in U.S. Pat. No. 4,001,725 works well at power levels up to about 1 kW. However, the low rated collector-to-emitter voltages of available bipolar transistors limits power output at the 100 kHz – 200 kHz frequency range. In addition, applying series-connected bipolar transistors can introduce unequal collector-to-emitter RF voltage and power dissipation among the transistors. A transistor breakdown could cause failures of the remaining transistors by excessive voltage. Also, secondary breakdown in bipolar transistors may be difficult to control in circuits where there are wide variations in operating conditions, as is the case with induction heating. Moreover, power losses within the bipolar transistors are high when switching high currents at high frequency (100 kHz – 200 kHz).

It is therefore an object of the present invention to provide a practical, solid-state power supply capable of supplying a high frequency, high power output to a load with flexibility to match a wide range of load impedances, which is readily expandable in power output, and which does not exhibit the drawbacks of prior power supplies.

SUMMARY OF THE INVENTION

The present invention is a self-excited solid-state oscillator for supplying a high-power RF inductive load. A typical load is an induction coil. The oscillator comprises at least one MOSFET transistor connected in a self-excited oscillator configuration, an output tuned circuit comprising an inductive load and a tank circuit connected to the load, the tank circuit having a resonant frequency determined at least in part by the inductance of the load coil, an RF feedback transformer coupling the tank circuit to the gate of the MOSFET for providing a switching signal to the MOSFET for causing the MOSFET to alternate between the on state and the off state at a frequency equal to the resonant frequency of the tank circuit, and bias circuit means for superimposing a bias voltage on the switching signal.

The present invention offers a number of advantages over other oscillators. (1) Since the invention employs a MOSFET instead of bipolar transistors, there are no secondary breakdown effects. (2) The positive temperature characteristics of the MOSFET permits multiple MOSFETs to be paralleled to increase power output capability. Current distribution among parallel MOSFETs tends to equalize as a result of the positive temperature characteristic. External forced-sharing networks are therefore not required. (3) The circuit is self-synchronizing. The MOSFET is switched using a feedback signal from the load, without the use of phase-locked loop circuits, rather than forced switching. This self-synchronization feature provides instant and automatic tracking with changes in the load. (4) Switching by the MOSFETs is done at near zero drain-to-source voltage, minimizing switching losses so that snubber circuits are not required, because of the 180 degree phase relation between gate and source and drain and source. (5) Stable high-frequency oscillation is attained by superimposing a positive forward bias voltage on the feedback signal to the gate of the MOSFET. This forward bias raises the MOSFET transconductance to start and maintain oscillation. (6) Output power to the load can be easily controlled. For example, output power can be changed by changing the dc supply voltage to the MOSFET drain-source circuit by well-known ac phase control circuits or by full-wave rectification of the ac line voltage followed by regulation using PWM or series pass techniques. Output power may also be controlled by pulse-width modulation of the gate-to-source voltage, creating essentially a burst oscillating circuit.

These and other advantages of the present invention will become clearer from the following description of the invention.

DESCRIPTION OF THE DRAWINGS

For the purpose of illustrating the invention, there is shown in the drawings a form which is presently preferred; it being understood, however, that this invention is not limited to the precise arrangements and instrumentalities shown.

FIG. 1 is a schematic diagram of a self-excited oscillator according to the present invention.

FIGS. 2A-2C illustrate waveforms of selected signals within the self-excited oscillator of FIG. 1A.

DESCRIPTION OF THE INVENTION

Figures 1A, 1B:
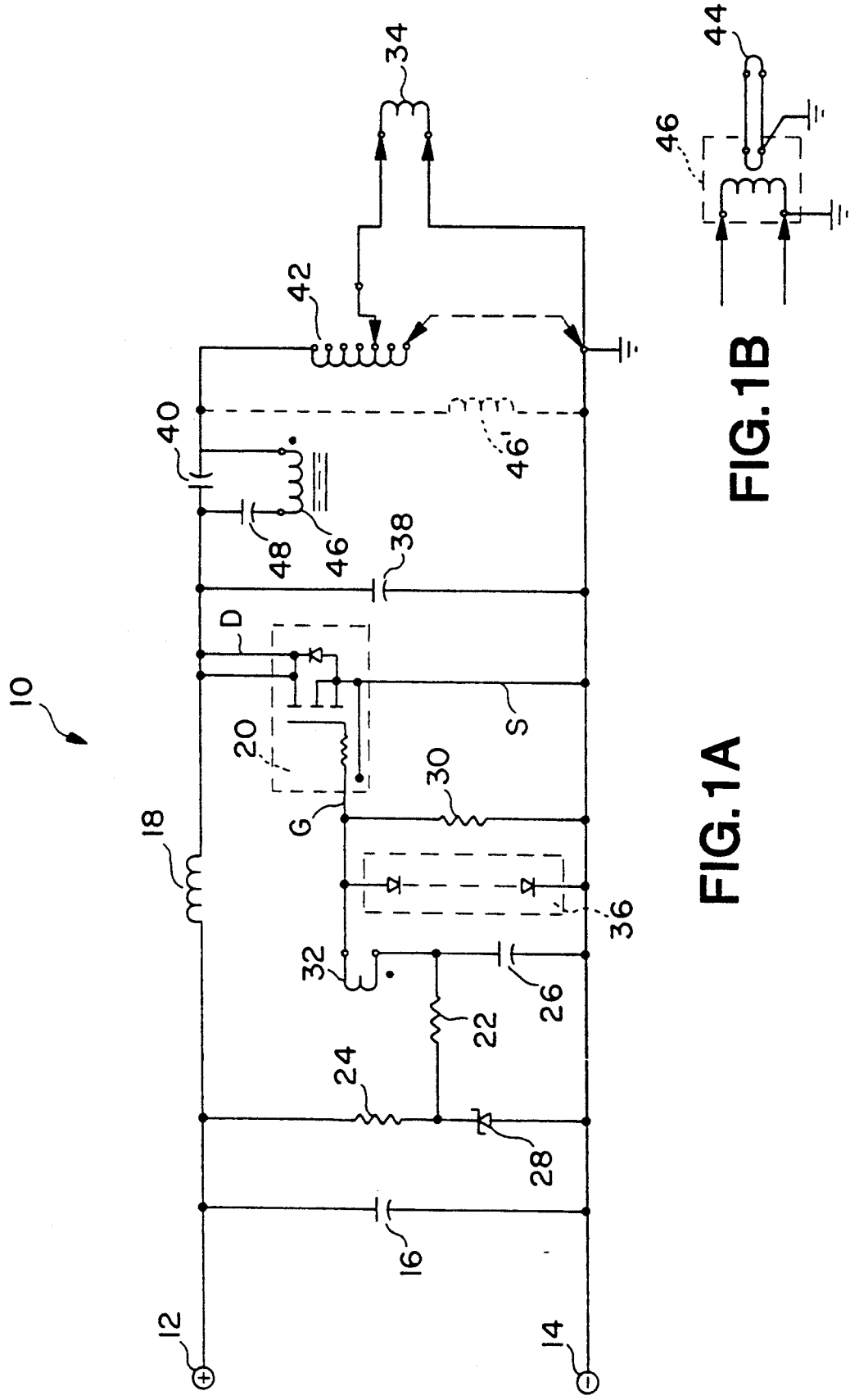
FIG. 1B illustrates an alternate output coupling circuit for the oscillator of FIG. 1A.

Referring now to the drawings, wherein like numerals indicate like elements, there is shown in FIG. 1 a self-excited oscillator 10 according to the present invention. Oscillator 10 is powered by a dc supply voltage applied to positive and negative input terminals 12 and 14, respectively. The dc supply voltage may be derived from any dc source. A line filter capacitor 16 and an RF choke 18 form a low-pass filter which isolates the dc source from the high frequency switching signals generated by the oscillator. Capacitor 16 and choke 18 attenuate RF energy that might be fed back to the dc source.

Oscillator 10 includes a dc bias network which provides a dc bias to MOSFET switch 20. The dc bias network comprises resistors 22 and 24, capacitor 26, Zener diode 28 and resistor 30. The dc bias is applied to the gate terminal G of MOSFET switch 20 through the secondary winding 32 of a feedback transformer whose primary winding 46 is connected to the induction coil 34, as will be described more fully below, which comprises part of the oscillator load. A diode clamp network 36 is connected from the gate G of MOSFET 20 to the negative dc input terminal 14. Diode clamp 36 limits positive-going gate drive voltages to within prescribed limits, charges capacitor 26 during the positive portions of the gate drive voltage so that the polarity of the voltage across capacitor 26 will assist in turning off MOSFET 20, and prevents excessive losses on the gate-source circuit of MOSFET 20. Capacitor 26 also blocks the dc bias voltage from being grounded. Its reactance is preferably very low and permits passage of the feedback signal (described below) to gate G of MOSFET 20. Resistor 30 maintains a resistance path between gate G and source S of MOSFET switch 20, and together with capacitor 26 establishes a negative bias to assist in turning off MOSFET switch 20. The dc bias voltage and the superimposed feedback signal, when applied to the gate G affect the drain current conduction period or conduction angle. By choosing a narrow conduction angle, higher efficiency is obtained.

Resistor 22 limits the charging current from the bias circuit to the gate capacitance of MOSFET 20. Limiting the charging current controls the transconductance of MOSFET 20. The switching capability of MOSFET 20 and the oscillator loading characteristics are therefore controlled by the gate charging current by controlling the value of resistor 22.

The drain D and source S terminals of MOSFET 20 are connected from the positive dc input terminal 12 to the negative dc input terminal 14. As will be understood by those skilled in the art, MOSFET 20 provides high-frequency switching to convert the dc input to high-frequency ac to induction coil 34.

It will be observed that, by using a MOSFET as the switching element, oscillator output power can be easily increased simply by connecting more than one MOSFET in series (for higher voltage) or in parallel (for higher current). It will also be observed that no special networks are required to assure equal current sharing in the MOSFETs when connected in parallel, as would be required in designs using bipolar transistors, for example, since the MOSFETs automatically share current equally when connected in parallel.

Induction coil 34 is part of a tuned circuit which forms the load for oscillator 10. The tuned circuit comprises energy storage capacitors 38 and 40, a multitapped tank inductor 42 and induction coil 34. Capacitors 38 and 40 store high-frequency energy with low inherent power loss. Capacitor 40 also functions as a dc block to prevent dc power from coupling from positive dc input terminal 12 to induction coil 34. The ratio of the capacitance of capacitor 40 to the capacitance of capacitor 38 provides an RF voltage multiplication to increase the effective voltage generated across the tank inductance. Additionally, capacitors 38 and 40 match the impedance of MOSFET 20 to the tank circuit. Tank inductor 42 is a multitapped coil which provides a wide range of matching to various induction coils 34. Inductor 42 may be connected directly to the induction coil 34, or may be indirectly connected to an induction coil 44 (illustrated as a single coil turn) through a matching transformer 46, as shown in FIG. 1B. The latter connection is advantageous when it is desired to drive a low impedance coil from oscillator 10. Inductor 42 is shown with a dotted ground connection at one end. This is an optional connection and changes inductor 42 to an autotransformer to increase the matching range for low-inductance induction coils.

Tank capacitors 38 and 40 perform three basic functions. In parallel with inductor 42, they establish the output frequency of the oscillator 10 and the "Q" of the oscillator necessary for energy transfer into the load. The impedance of MOSFET 20 is matched by connecting drain D to source S across the series capacitor 40. The ratio of the capacitors provides an increase of the load coil voltage. The "boost" across the load coil increases the coil amperes and facilitates energy transfer into loosely coupled loads. Since the power to the load is proportional to the square of the product of load coil turns and coil amperes, the loading of the oscillator and power to the load are increased.

Feedback for the self-excited oscillator 10 is derived from the primary winding 46. Primary 46 is driven by the oscillatory voltage developed across tank capacitor 40. A blocking capacitor 48 is provided as a dc block to prevent dc from coupling to primary 46. The capacitance of capacitor 48 is chosen to present a very low impedance at the oscillation frequency. Primary 46 and secondary 32 together comprise a feedback transformer which steps down the oscillatory voltage across capacitor 40 in the tank circuit and couples it to the gate G of MOSFET 20. In order to step down the voltage, primary 46 has a higher number of turns than secondary 32. Secondary 32 provides the proper magnitude and phase of the gate drive voltage to cause MOSFET 20 to operate as an oscillator.

As an alternative, the primary of the feedback transformer may be connected across the drain D and source S terminals of MOSFET switch 20, as shown in phantom in FIG. 1 and designated as 46'. In this alternative arrangement, blocking capacitor 48 is not required and may be omitted. Otherwise, operation of the circuit is the same in this alternative embodiment as in the embodiment just described.

When dc power is applied to oscillator 10, the oscillator reaches steady-state oscillation in less than one microsecond. When dc power is applied, the gate-to-source capacitance of MOSFET 20 is charged by the dc forward bias supplied by the dc bias network composed of resistors 22 and 24, capacitor 26 and Zener diode 28. Capacitors 38 and 40 become charged and then discharge energy to the series-connected tank inductor 42 and induction coil 34. This is the beginning of the oscillations in the tank circuit consisting of capacitors 38 and 40 and inductors 42 and 34. In the meantime, the transconductance (or gain) of MOSFET 20 has increased due to the dc bias applied to the gate G of MOSFET 20. The oscillation voltage now being generated in the tank circuit is applied across primary 46 of the feedback transformer from capacitor 40. Capacitor 48, as already described, acts as a dc block but allows the high-frequency oscillations from the tank circuit to appear across primary 46.

The feedback transformer composed of primary 46 and secondary 32 steps down the high-frequency voltage across capacitor 40 by reason of its turns ratio. Secondary 32 supplies the stepped-down high-frequency voltage to the gate G of MOSFET 20 at the proper magnitude and phase. The proper phase is such that the applied gate-to-source voltage is 180 degrees out of phase with the drain-to-source voltage. The gate driving frequency is always in synchronism with the frequency of the resonant tuned circuit. The gate-to-source voltage applied to MOSFET 20 is actually the high-frequency feedback signal superimposed on the dc bias voltage. Diode 36, when forward biased, limits the gate voltage to prevent damage to MOSFET 20. In addition, when the voltage polarity on gate G is positive, diode 36 conducts, charging capacitor 26 negative from ground. This negative voltage applied to gate G assists in turning MOSFET 20 off and restricts the angle of the current flow to less than 180 degrees of the oscillation cycle when MOSFET 20 conducts.

MOSFET 20 is preferably, although not necessarily, a multiple chip assembly and has a high current capacity and high frequency capability. In operation, MOSFET 20 acts as a high-frequency switch, controlling the energy delivered from the dc supply to the energy-storing tuned circuit comprising capacitors 38 and 40, inductor 42 and induction coil 34.

MOSFET 20, being connected across capacitor 38 of the tank circuit, works into only a fraction of the total impedance of the tank circuit. Capacitor 40 provides a "boost" in voltage to the induction coil 34. This "boost" in induction coil voltage increases the current through the induction coil and, consequently, the energy induced to the heated part.

As noted above, output power can be changed by changing the dc supply voltage to the MOSFET drain-source voltage by any known ac phase control circuit, or by fullwave rectification of the ac line voltage followed by modulating the gate-to-source voltage of the MOSFET using pulse-width modulation (PWM) or series pass techniques. It is believed that the ac phase control circuits and the PWM and series pass techniques are well-understood by those skilled in the art and need not be described in detail. In any event, the particular details of the ac phase control circuitry, or the particular details of the PWM or series pass techniques employed are not critical to the present invention.

Representative waveforms for oscillator 10 are shown in FIGS. 2A-2C. FIG. 2A shows the sinusoidal shape of the tank circuit voltage, which comprises the oscillator output. FIG. 2B illustrates the MOSFET 20 drain-to-source voltage. It should be noted that the conduction angle of the MOSFET 20 is approximately 120°. FIG. 2C shows the MOSFET 20 gate-to-source voltage as fed back by the feedback transformer.

The present invention may be embodied in other specific forms without departing from the spirit or essential attributes thereof and, accordingly, reference should be made to the appended claims, rather than to the foregoing specification, as indicating the scope of the invention.

I claim:

1. A self-excited solid-state oscillator for supplying a high-power RF inductive load, comprising
   (a) at least one MOSFET transistor connected in a self-excited oscillator configuration;
   (b) an output tuned circuit comprising an inductive load and a tank circuit connected to the load, the tank circuit having a resonant frequency determined at least in part by the inductance of the load;
   (c) an RF feedback transformer coupling the tank circuit to the gate of the MOSFET for providing a switching signal to the MOSFET for causing the MOSFET to alternate between the on state and the off state at a frequency equal to the resonant frequency of the tank circuit; and
   (d) bias circuit means for superimposing a forward bias voltage on the switching signal.

2. A self-excited solid-state oscillator according to claim 1, further comprising means for modulating the switching signal to the MOSFET.

3. A self-excited solid-state oscillator according to claim 2, wherein the means for modulating the switching signal comprises a pulse-width modulator.

4. A power supply for supplying power to an inductive load, comprising
   (a) a source of input power,
   (b) a tank circuit for connection to said inductive load, the tank circuit having a resonant frequency determined at least in part by the inductance of said load, (c) at least one MOSFET transistor connected in a self-excited oscillator configuration between the source of input power and the load, (d) feedback means coupling the tank circuit to the gate of the MOSFET for providing a switching signal to the MOSFET for switching the MOSFET alternately between an on state and an off state at a frequency equal to the resonant frequency of the tank circuit, (e) pulse-width modulator means for modulating the switching signal to the MOSFET, and (f) bias circuit means for superimposing a bias voltage on the switching signal for biasing the MOSFET into its forward conduction region.

* * * * *